United States Patent
Ito

(10) Patent No.: US 8,520,792 B2
(45) Date of Patent: Aug. 27, 2013

(54) PHASE ADJUSTING DEVICE AND CAMERA

(75) Inventor: Daiki Ito, Tokyo (JP)

(73) Assignee: Nikon Corporation, Tokyo (JP)

( * ) Notice: Subject to any disclaimer, the term of this patent is extended or adjusted under 35 U.S.C. 154(b) by 33 days.

(21) Appl. No.: 13/401,049

(22) Filed: Feb. 21, 2012

(65) Prior Publication Data
US 2012/0213309 A1    Aug. 23, 2012

(30) Foreign Application Priority Data

Feb. 23, 2011 (JP) ................................ 2011-037324

(51) Int. Cl.
*H04L 7/00* (2006.01)

(52) U.S. Cl.
USPC ......................................... 375/371; 375/376

(58) Field of Classification Search
USPC .................. 375/371, 376, 294; 327/116, 156, 327/158, 276; 331/25; 455/103, 127, 307, 455/325; 324/76.54; 708/250
See application file for complete search history.

(56) References Cited

U.S. PATENT DOCUMENTS

| 7,243,117 B2 * | 7/2007 | Yamamoto et al. ........... 708/250 |
| 2008/0112522 A1 | 5/2008 | Fukuda et al. |
| 2010/0111227 A1 * | 5/2010 | Philippe ........................ 375/300 |
| 2011/0298536 A1 * | 12/2011 | Okazaki et al. ............... 330/107 |

FOREIGN PATENT DOCUMENTS

| JP | A-2000-196575 | 7/2000 |
| JP | A-2008-124714 | 5/2008 |

OTHER PUBLICATIONS

Dec. 25, 2012 Japanese Office Action issued in Japanese Application No. 2011-037324 (with translation).

\* cited by examiner

*Primary Examiner* — Khai Tran
(74) *Attorney, Agent, or Firm* — Oliff & Berridge, PLC

(57) ABSTRACT

A determining unit of a phase adjusting device determines whether or not a data stream to be detected included in serial transfer data can be detected in each output (first output to fourth output) of a first data obtaining unit and a second data obtaining unit. A phase adjusting unit adjusts a delay amount given to the serial transfer data to be output based on a determination result of the determining unit.

7 Claims, 7 Drawing Sheets

PHASE ADJUSTING DEVICE AND CAMERA

CROSS-REFERENCE TO THE RELATED APPLICATION

This application is based upon and claims the benefit of priority from Japanese Patent Application No. 2011-037324, filed on Feb. 23, 2011, the entire contents of which are incorporated herein by reference.

BACKGROUND

1. Field

The present application relates to a phase adjusting device and a camera.

2. Description of the Related Art

In recent years, accompanying an increase in the number of pixels in an image pickup device, an electronics device, such as an electronic camera, is requested to further increase the speed of digital data transfer. In designing such an electronics device, a relationship in phase between data and clock is maintained by suppressing variations in data delay by impedance control of a transmission path, equal-length wiring, selection of materials of a printed board etc., simulation of a signal waveform, etc.

It is known that the relationship in phase between data and clock also changes depending on heat generation when an electronics device is operated continuously and the configuration of peripheral circuits. As an example of countermeasures against this, in Japanese Unexamined Patent Application Publication No. 2008-124714, a configuration of a circuit is disclosed, which adjusts a threshold value for determining the voltage of an input signal and at the same time, adjusts the relationship in phase between data and clock using two kinds of clocks in different phases.

However, there is still room for improvement in the above-described Japanese Unexamined Patent Application Publication No. 2008-124714 in that in actuality, it is difficult to determine a threshold value for determining a voltage and it becomes difficult to maintain precision of two kinds of clocks when clock's speed is increased.

SUMMARY

A phase adjusting device of one aspect includes a first data obtaining unit, a second data obtaining unit, a determining unit, and a phase adjusting unit. The first data obtaining unit obtains each of a first output in a reference phase of serial transfer data to be input and a second output being given a phase difference to the first output by a first delay amount. The second data obtaining unit obtains each of a third output being given a phase difference to the first output by a second delay amount larger than the first delay amount and a fourth output being given a phase difference to the third output by the first delay amount. The determining unit determines whether or not a data stream to be detected included in serial transfer data can be detected in each output of the first data obtaining unit and the second data obtaining unit. The phase adjusting unit adjusts a delay amount given to the serial transfer data to be output based on a determination result by the determining unit.

DETAILED DESCRIPTION OF THE EMBODIMENTS

<Configuration Example of Phase Adjusting Device in One Embodiment>

Figure 1:
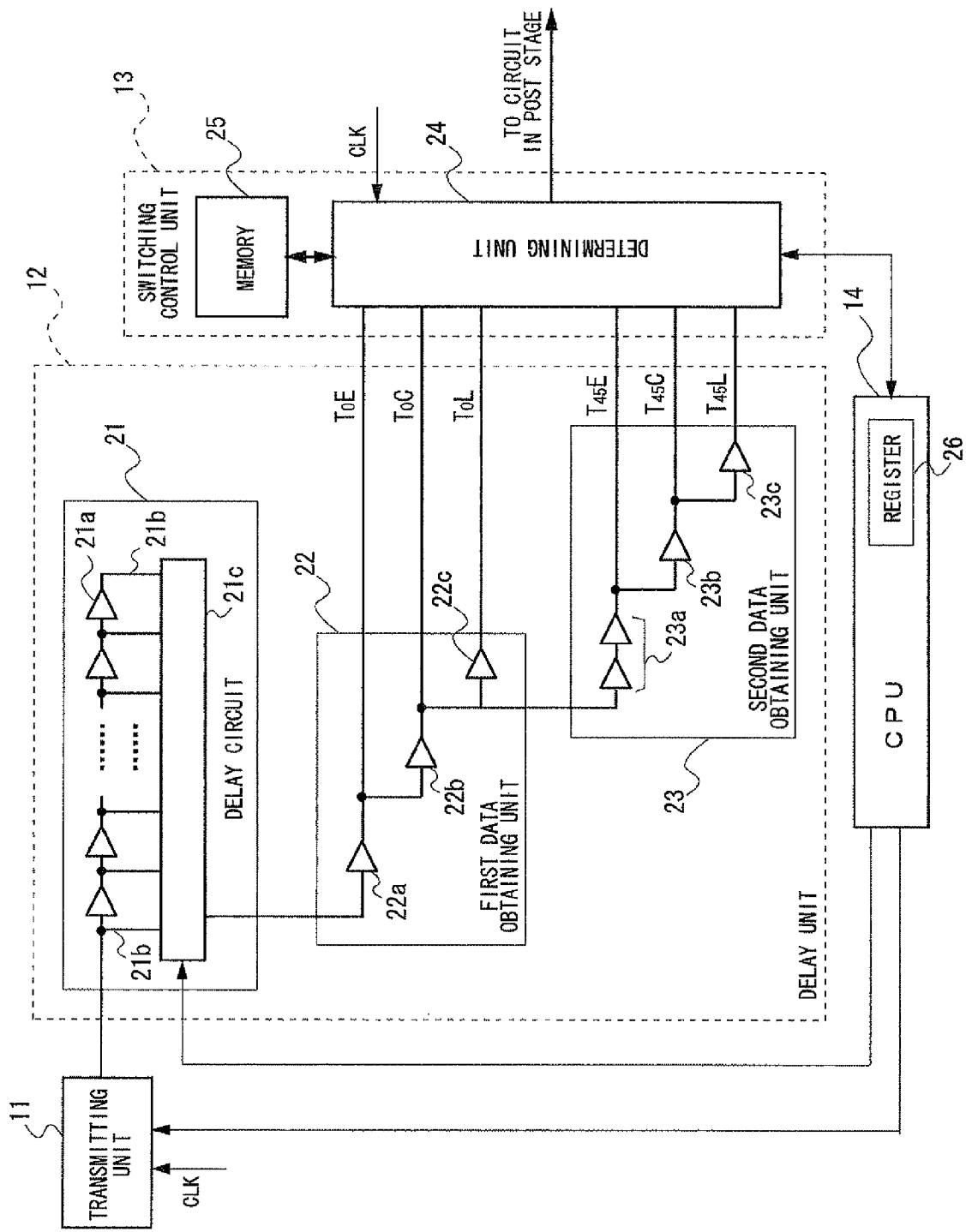
FIG. 1 is a schematic diagram showing a configuration example of a phase adjusting device in one embodiment.

FIG. 1 is a schematic diagram showing a configuration example of a phase adjusting device in one embodiment. The phase adjusting device is a circuit that adjusts the phase of a digital data signal to be input and then outputs the signal to a post stage. The phase adjusting device in one, embodiment is mounted on an electronic camera and as an example, is arranged in a digital data transmission path between an image pickup device of an electronic camera and a digital front end circuit. The phase adjusting device may be incorporated in any kind of circuit of an electronic camera as long as it transfers a digital data signal.

The phase adjusting device in FIG. 1 has a transmitting unit 11, a delay unit 12, a switching control unit 13, and a CPU 14. The transmitting unit 11, the delay unit 12, and the switching control unit 13 are connected with the CPU 14, respectively. Further, to each circuit of the phase adjusting device, a clock signal CLK is supplied (in FIG. 1, part of a CLK signal line is not shown schematically).

The transmitting unit 11 is a circuit that outputs a data packet (serial transfer data) that is transferred in the serial scheme to a circuit in a post stage. The output of the transmitting unit 11 is connected with the delay unit 12.

In the example of one embodiment, it is assumed that a digital data signal is transmitted by the double data rate (DDR) scheme at a rate of 400 Mbps as serial transfer data.

Figures 2, 3:
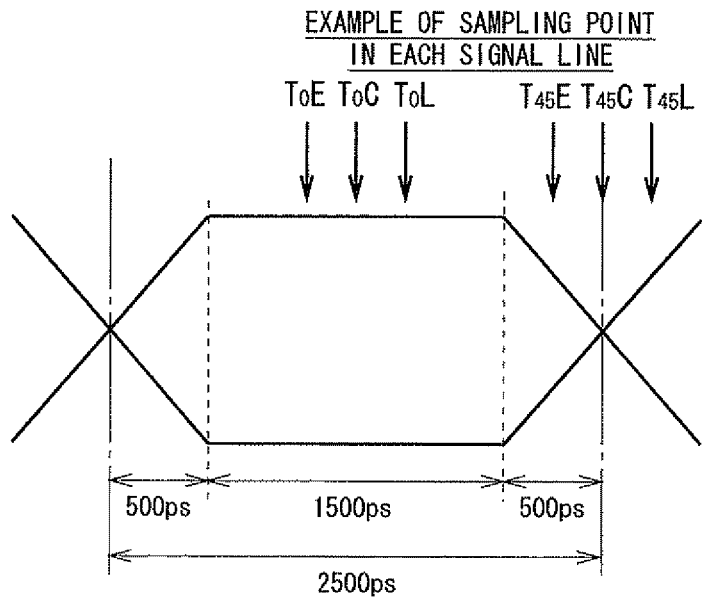
FIG. 2 is a diagram showing an example of an eye pattern in DDR data of 400 Mbps.
FIG. 3 is a schematic diagram showing an example of a lookup table of a memory.

FIG. 2 shows an example of an eye pattern in the DDR data of 400 Mbps. In the example of one embodiment, it is assumed that the cycle of data corresponding to one bit is 2,500 ps. Each 500 ps at the front and end of the cycle of 1-bit data is the rise time or fall time, both corresponding to an undefined interval of data.

The serial transfer data in one embodiment is image data generated by an image pickup device (not shown schematically). The image data includes a horizontal synchronizing signal indicating a break of the scan line of the image and a vertical synchronizing signal indicating a break of one frame in addition to a pixel signal indicating luminance and a color difference (or luminance of RGB) in each pixel. In one embodiment, it is assumed that phases are adjusted using the above-mentioned synchronizing signals.

Here, the horizontal synchronizing signal and the vertical synchronizing signal in one embodiment are made of data of six words combining a word "FFF (h)" in which "1" appears 12 times successively, a word "000 (h)" in which "0" appears 12 times successively, and a word "AAA (h)" indicating "101010101010", the bit depth of which is 12 bits. For example, the vertical synchronizing signal is set to "000 (h), AAA (h), 000 (h), FFF (h), FFF (h), FFF (h)". Similarly, the horizontal synchronizing signal is set to, for example, "000 (h), AAA (h), 000 (h), FFF (h), FFF (h), 000 (h)". In one embodiment, an example is explained in which phase adjustment processing is performed on a data stream of "AAA (h)" included in the synchronizing signal as a data stream to be detected.

Returning to FIG. 1, the delay unit 12 is a circuit that adjusts a delay amount of serial transfer data and has a delay circuit 21, a first data obtaining unit 22, and a second data obtaining unit 23.

The serial transfer data input from the transmitting unit 11 is first input to the delay circuit 21. The delay circuit 21 has a plurality of delay elements 21a (inverters etc.) connected in series across a plurality of stages, a plurality of paths 21b connected with the outputs of the respective delay elements 21a, and a selector 21c connected to the respective paths 21b described above. The selector 21c selects any of the paths 21b in response to an instruction of the CPU 14 and adjusts a delay amount A of an offset in the delay circuit 21. The output of the selector 21c of the delay circuit 21 is connected to the first data obtaining unit 22.

The first data obtaining unit 22 is a 1-input 3-output circuit that generates data the phases of which are advanced and delayed with respect to input data. The first data obtaining unit 22 has three programmable delay elements (22a, 22b, 22c) having the same configuration. In one embodiment, the delay amount of each of the delay elements 22a, 22b, and 22c is set to the same delay amount (200 ps).

The input of the first data obtaining unit 22 is connected to the delay element 22a. The output of the delay element 22a branches into a signal line $T_0E$ and the input of the delay element 22b. The output of the delay element 22b branches into a signal line $T_0C$, the input of the delay element 22c, and the input of the second data obtaining unit 23. The output of the delay element 22c is connected to a signal line $T_0L$. The signal lines $T_0E$, $T_0C$, and $T_0L$ are connected to the switching control unit 13, respectively.

Here, in one embodiment, the phase of the signal line $T_0C$ is set to a reference phase of serial transfer data. The output of the signal line $T_0E$ in the first data obtaining unit 22 does not pass through the delay element 22b, and therefore, is advanced in phase by an amount corresponding to 200 ps from the output of the signal line $T_0C$. The output of the signal line $T_0L$ further passes through the delay element 22c, and therefore, is delayed in phase by an amount corresponding to 200 ps from the output of the signal line $T_0C$.

Consequently, it is possible for the first data obtaining unit 22 to obtain the output in the reference phase ($T_0C$) and two kinds of outputs ($T_0E$ and $T_0L$) given phase differences corresponding to ±200 ps with respect to the output in the reference phase, respectively.

The second data obtaining unit 23 is a 1-input 3-output circuit having substantially the same configuration as that of the first data obtaining unit 22.

The input of the second data obtaining unit 23 is connected to a delay element 23a that gives a delay amount corresponding to 1,050 ps. The output of the delay element 23a branches into a signal line $T_{45}E$ and the input of a delay element 23b that gives a delay amount corresponding to 200 ps. The output of the delay element 23b branches into a signal line $T_{45}C$ and the input of a delay element 23c that gives a delay amount corresponding to 200 ps. The output of the delay element 23c is connected to a signal line $T_{45}L$. The signal lines $T_{45}E$, $T_{45}C$, and $T_{45}L$ are connected to the switching control unit 13, respectively.

Here, to the output of the signal line $T_{45}C$ of the second data obtaining unit 23, a delay amount of 1,250 ps is given by the delay element 23a and the delay element 23b with respect to the output of the signal line $T_0C$ in the reference phase. One data cycle in one embodiment is 2,500 ps. Consequently, the phase of the signal line $T_{45}C$ has a phase difference of 45 degrees with respect to the reference phase of the signal line $T_0C$ as a result.

The output of the signal line $T_{45}E$ in the second data obtaining unit 23 does not pass through the delay element 23b, and therefore, is advanced in phase by an amount corresponding to 200 ps from the output of the signal line $T_{45}C$. The output of the signal line $T_{45}L$ further passes through the delay element 23c, and therefore, is delayed in phase by an amount corresponding to 200 ps from the output of the signal line $T_{45}C$. Consequently, it is possible for the second data obtaining unit 23 to obtain the output ($T_{45}C$) having a phase difference of 45 degrees with respect to the reference phase and two kinds of outputs ($T_{45}E$ and $T_{45}L$) given phase differences corresponding to ±200 ps with respect to the output of $T_{45}C$, respectively.

The switching control unit 13 is a 6-input 1-output selector that selectively outputs data of any one of the signal lines $T_0E$, $T_0C$, $T_0L$, $T_{45}E$, $T_{45}C$, and $T_{45}L$ to a circuit in the post stage. Further, the switching control unit 13 has a determining unit 24 that operates in phase adjustment processing, to be described later, and a memory 25.

The determining unit 24 takes in the signal value of each signal line in synchronization with the timing of rise or fall of the clock signal CLK. Then, the determining unit 24 determines whether or not the above-mentioned data stream to be detected ("AAA (h)" of the synchronizing signal) can be detected in each signal line and outputs the determination result in each signal line to the CPU 14.

The memory 25 is a nonvolatile memory that stores a lookup table (LUT) applied in phase adjustment processing. Here, with reference to FIG. 3, the contents of LUT are explained. LUT stores a correspondence relationship between 13 kinds of sample bit patterns and arguments (CASE numbers). Each sample bit pattern corresponds to a 24-bit pattern including "AAA (h)" cut out in a different position from the range of "000 (h), AAA (h), 000 (h)" of the synchronizing signal.

For example, the first bit to the twelfth bit of the sample bit pattern with CASE number 0 correspond to "AAA (h)" and the 12 remaining bits are all "0". The sample bit pattern with CASE number 1 is a bit pattern in which the bits corresponding to "AAA (h)" shift one bit backward in the bit pattern with CASE number 0. That is, the second bit to the thirteenth bit of the sample bit pattern with CASE number 1 correspond to "AAA (h)" and the other remaining bits are all "0". In this manner, it is assumed that each time CASE number increases by one, the bits corresponding to "AAA (h)" shift one bit backward in the sample bit patterns in LUT.

In the example in FIG. 3, CASE numbers are represented by the hexadecimal numbers (0 to F). Further, CASE numbers of sample bit patterns in LUT are in the range from "0 to C." CASE number D in one embodiment is handled as a symbol indicating the case where any sample bit pattern is not matched. It is assumed that LUT described above is generated in advance by a manufacturer.

Returning to FIG. 1, the CPU 14 is a processor that performs total control of the phase adjusting device. As an example, the CPU 14 performs various kinds of processing including controlling the output of serial transfer data by the transmitting unit 11, issuing an instruction to switch paths to the selector, and issuing an instruction to switch outputs by the switching control unit 13. The CPU 14 has a register 26 that stores the state of each flag, to be described later.

<Operation Example of Phase Adjusting Device>

Next, an operation example of the phase adjusting device in one embodiment is explained. When receiving an instruction to start phase adjustment processing (for example, an instruction to record and pick up an image by pressing a release button of an electronic camera) from a user, the CPU 14 issues a start signal to each part to cause the part to start phase adjustment processing. Hereinafter, with reference to the flowchart in FIG. 4, an operation example of phase adjustment processing in one embodiment is explained.

(Step S101)

The CPU 14 makes an initial setting of the delay amount A of the delay circuit 21 by a path specification by the selector. For example, the CPU 14 reads the delay amount of the delay circuit 21 set in the previous phase adjustment processing or the default value of the delay circuit 21 from the register 26 and sets the read value as the above-mentioned delay amount A.

(Step S102)

The CPU 14 initializes the following flags of the register 26. Specifically, the CPU 14 resets flags ($T_0E\_P$, $T_0C\_P$, $T_0L\_P$, $T_{45}E\_P$, $T_{45}C\_P$, $T_{45}L\_P$) indicating whether or not the data stream to be detected is detected in each signal line, a flag ($T_{0\_}D$) indicating the detection state in the three outputs of the first data obtaining unit 22, and a flag ($T_{45\_}D$) indicating the detection state in the three outputs of the second data obtaining unit 23 to "0", respectively.

(Step S103)

The transmitting unit 11 starts to output serial transfer data (image data) in response to the instruction of the CPU 14. The serial transfer data output from the transmitting unit 11 passes through the delay unit 12 in the pipeline scheme. Due to this, serial transfer data having phases different from one another is input from the signal lines $T_0E$, $T_0C$, $T_0L$, $T_{45}E$, $T_{45}C$, and $T_{45}L$ to the switching control unit 13.

(Step S104)

The determining unit 24 samples the output of each signal line in synchronization with a clock signal. Then, the determining unit 24 determines whether or not the data stream to be detected is detected in each signal line. Hereinafter, with reference to the flowchart in FIG. 5, an operation example of the determining unit 24 in S104 for the output of the signal line $T_0E$ is explained.

Step S201: The determining unit 24 obtains a 24-bit digital data stream by sampling the output of the signal line $T_0E$.

Step S202: The determining unit 24 refers to LUT of the memory 25 and collates the sample bit pattern of LUT with the data stream in S201. Due to this, the determining unit 24 obtains the CASE number of LUT corresponding to the data stream in S201.

Step S203: The determining unit 24 determines whether or not the CASE number obtained in S202 is "D". When the determination result is affirmative (YES side), processing moves to S204. The YES side in S204 corresponds to the case where the data stream in S201 is not the data stream to be detected. On the other hand, when the determination result is negative (NO side), processing moves to S205. The NO side in S204 corresponds to the case where the data stream in S201 includes the data stream to be detected (the case where the CASE number is any of "0 to C").

Step S204: The determining unit 24 determines whether or not a predetermined time has elapsed after the start signal is issued. When the determination result is affirmative (YES side), processing moves to S205. The YES side in S204 corresponds to the case where the determining unit 24 aborts detection of the data stream in the signal line $T_0E$ in the state where the data stream to be detected is not detected. On the other hand, when the determination result is negative (NO side), the determining unit 24 returns the procedure to S201 to repeat the above-described operation.

Step S205: The determining unit 24 determines whether or not the CASE number obtained in the immediately previous processing in S202 is "D". When the determination result is affirmative (YES side), processing moves to S206. On the other hand, when the determination result is negative (NO side), processing moves to S207. Step S206: The determining unit 24 outputs a signal that sets the flag $T_0E\_P$ of the register 26 to "0" to the CPU 14. Then, the procedure returns to processing in S105 in FIG. 4.

Step S207: The determining unit 24 outputs a signal that sets the flag $T_0E\_P$ of the register 26 to "1" to the CPU 14 and at the same time, records information of the CASE number corresponding to the signal line $T_0E$ in the register 26. Then, the procedure returns to processing in S105 in FIG. 4.

Figure 5:
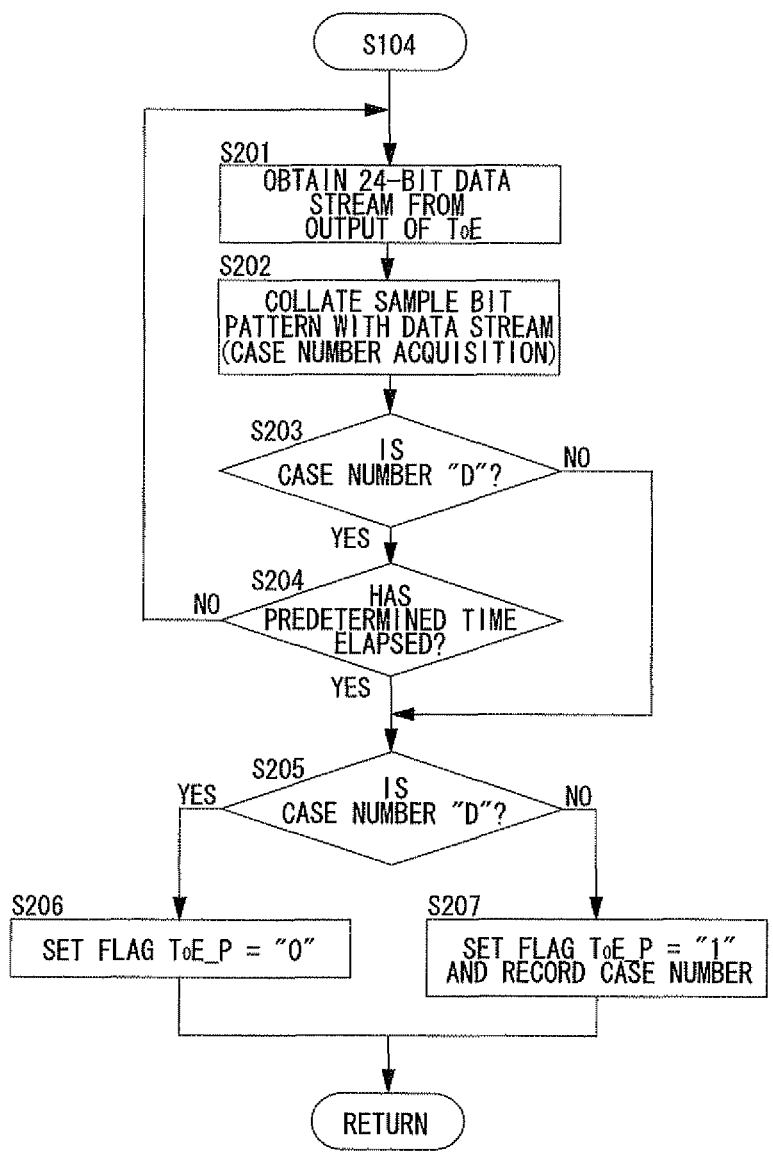
FIG. 5 is a flowchart showing an operation example of a determining unit in S104 on an output of a signal line $T_0E$.

Explanation of the flowchart in FIG. 5 is completed as above. As a matter of course, the determining unit 24 in S104 performs the same processing as that in FIG. 5 also on signal lines other than $T_0E$. Due to this, in the register 26, the flags ($T_0E\_P$, $T_0C\_P$, $T_0L\_P$, $T_{45}E\_P$, $T_{45}C\_P$, $T_{45}L\_P$) indicating whether or not the data stream to be detected is detected in each signal line are updated. As to the signal line in which the data stream to be detected is detected, information of the CASE number is recorded in the register 26.

(Step S105)

The CPU 14 refers to the flags $T_0E\_P$, $T_0C\_P$, and $T_0L\_P$ of the register 26 and sets the flag $T_{0\_}D$ indicating the detection state in the three outputs of the first data obtaining unit 22. Similarly, the CPU 14 refers to the flags $T_{45}E\_P$, $T_{45}C\_P$, and $T_{45}L\_P$ of the register 26 and sets the flag $T_{0\_}D$ indicating the detection state in the three outputs of the first data obtaining unit 22.

As an example, in S105, it is sufficient for the CPU 14 to set the flag $T_{0\_}D$ by the processing in (a) to (h) below. In the processing to set the flag $T_{45\_}D$, the flags in the processing in (a) to (h) are only replaced with $T_{45}E\_P$, $T_{45}C\_P$, $T_{45}L\_P$, and $T_{45\_}D$, respectively. Therefore, explanation about the processing to set the flag $T_{45\_}D$ is omitted.

(a) When $T_0E\_P$, $T_0C\_P$, and $T_0L\_P$ are all "0" ($T_0E\_P=T_0C\_P=T_0L\_P=0$), the CPU 14 sets the flag $T_{0\_}D$ of the register 26 to "0".

(b) When $T_0E\_P$ is "1" and $T_0C\_P$ and $T_0L\_P$ are "0" ($T_0E\_P=1$, $T_0C\_P=T_0L\_P=0$), the CPU 14 sets the flag $T_{0\_}D$ of the register 26 to "1".

(c) When $T_0C\_P$ is "1" and $T_0E\_P$ and $T_0L\_P$ are "0" ($T_0C\_P=1$, $T_0E\_P=T_0L\_P=0$), the CPU 14 sets the flag $T_{0\_}D$ of the register 26 to "2".

(d) When $T_0L\_P$ is "1" and $T_0E\_P$ and $T_0C\_P$ are "0" ($T_0L\_P=1$, $T_0E\_P=T_0C\_P=0$), the CPU 14 sets the flag $T_{0\_}D$ of the register 26 to "3".

(e) When $T_0C\_P$ and $T_0L\_P$ are "1" and $T_0E\_P$ is "0" ($T_0C\_P=T_0L\_P=1$, $T_0E\_P=0$), the CPU 14 sets the flag $T_{0\_}D$ of the register 26 to "4".

(f) When $T_0E\_P$ and $T_0L\_P$ are "1" and $T_0C\_P$ is "0" ($T_0E\_P=T_0L\_P=1$, $T_0C\_P=0$), the CPU 14 sets the flag $T_{0\_}D$ of the register 26 to "5".

(g) When $T_0E\_P$ and $T_0C\_P$ are "1" and $T_0L\_P$ is "0" ($T_0E\_P=T_0C\_P=1$, $T_0L\_P=0$), the CPU 14 sets the flag $T_{0\_}D$ of the register 26 to "6".

(h) When $T_0E\_P$, $T_0C\_P$, and $T_0L\_P$ are all "1" ($T_0E\_P=T_0C\_P=T_0L\_P=1$), the CPU 14 sets the flag $T_0\_D$ of the register 26 to "7".

(Step S106)

The CPU 14 refers to the flags $T_0\_D$ and $T_{45}\_D$ and selects an output of the switching control unit 13 and at the same time, sets a correction value of the delay amount A of the delay circuit 21. Hereinafter, an operation example of the CPU 14 in S106 is explained with reference to the flowchart in FIG. 6.

Step S301: The CPU 14 determines whether or not the flag $T_0\_D$ is "7". When the determination result is affirmative (YES side), processing moves to S302. On the other hand, when the determination result is negative (NO side), processing moves to S303.

Figure 6:
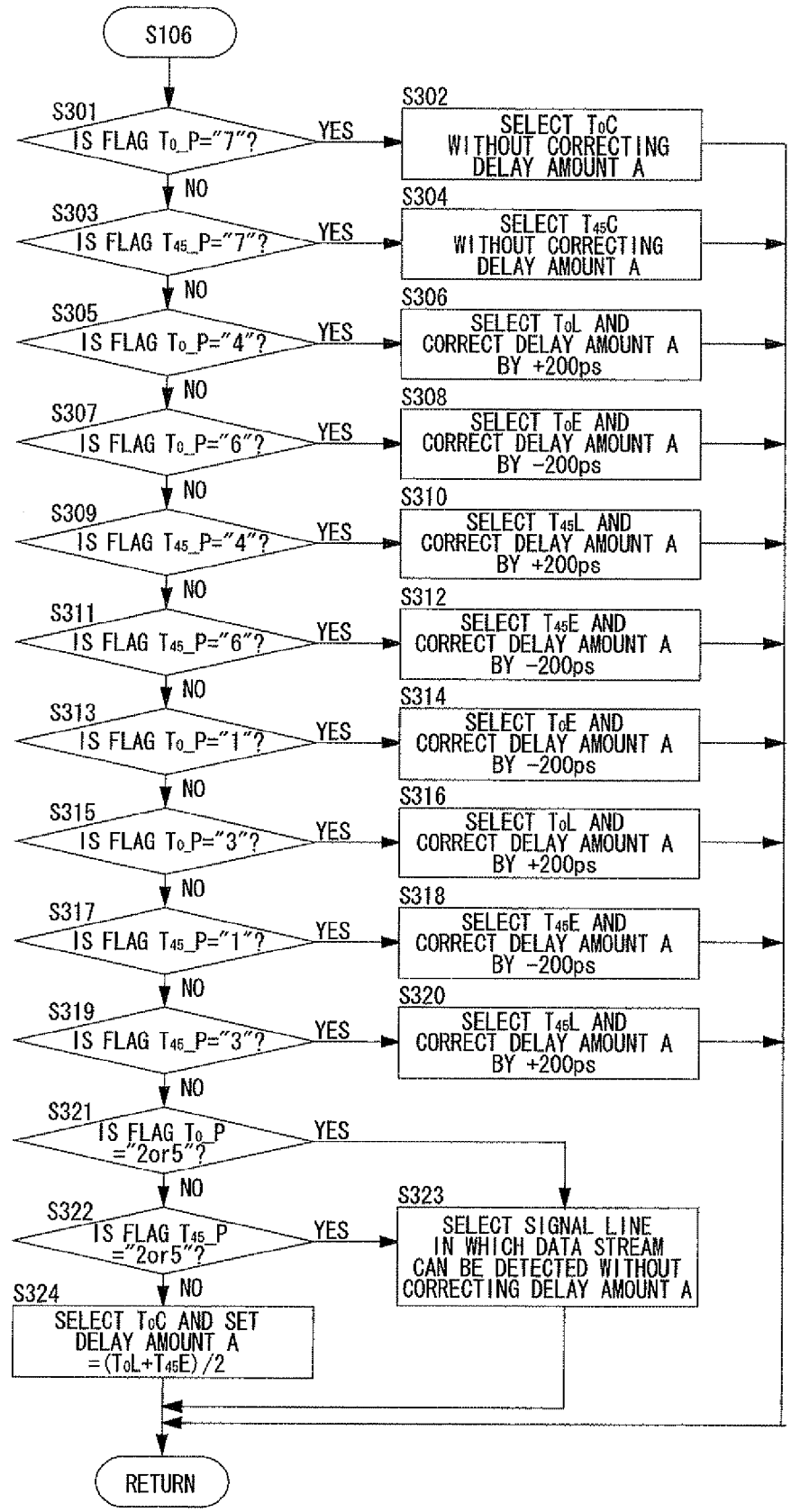
FIG. 6 is a flowchart showing an operation example of CPU in S106.
Figure 7A:
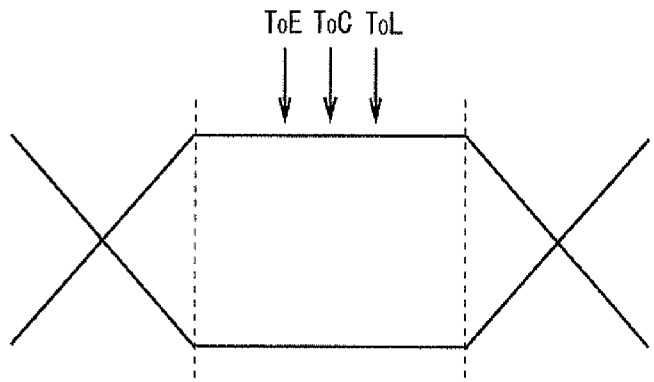
FIG. 7A is a diagram showing an example of a sampling state in S302.
Figure 7B:
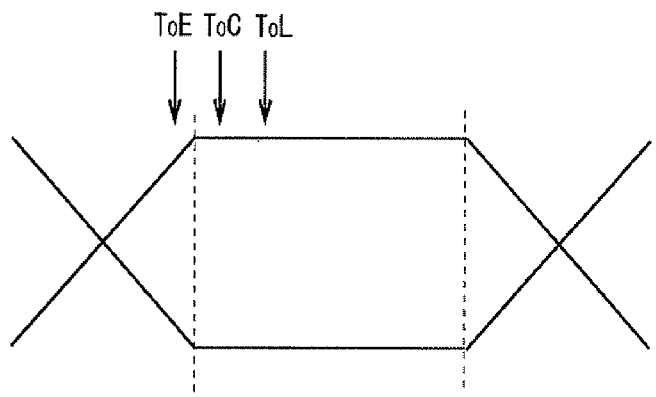
FIG. 7B is a diagram showing an example of a sampling state in S306.

Step S302: This case is a case where the data stream to be detected can be detected in all the three signal lines in the first data obtaining unit 22 (see FIG. 7A). In this case, it is possible to sample data more stably when using the output of the signal line the phase of which is in the middle in the time axis direction of the three outputs and confidence of the data to be transferred becomes high. Consequently, in S302, the CPU 14 selects the output of the signal line $T_0C$ as the output of the switching control unit 13. Further, in S302, the CPU 14 applies the delay amount A as it is without correction. Then, the processing of the flowchart in FIG. 6 is completed.

Step S303: The CPU 14 determines whether or not the flag $T_{45}\_D$ is "7". When the determination result is affirmative (YES side), processing moves to S304. On the other hand, when the determination result is negative (NO side), processing moves to S305.

Step S304: This case is a case where the data stream to be detected can be detected in all the three signal lines in the second data obtaining unit 23. In S304, the CPU 14 selects the output of the signal line $T_{45}C$ as the output of the switching control unit 13. In S304, the CPU 14 applies the delay amount A as it is without correction. Then, the processing of the flowchart in FIG. 6 is completed. S304 is substantially the same as S302 described above, and therefore, explanation duplicated with S302 is omitted.

Step S305: The CPU 14 determines whether or not the flag $T_0\_D$ is "4". When the determination result is affirmative (YES side), processing moves to S306. On the other hand, when the determination result is negative (NO side), processing moves to S307.

Step S306: This case is a case where the data stream to be detected can be detected from $T_0C$ and $T_0L$ successive in the order of phase of the three signal lines in the first data obtaining unit 22 (see FIG. 78). In this case, the fall and the rise of the waveform exist between the phase of $T_0E$ and the phase of $T_0C$, and therefore, it is possible to sample data more stably when using the output of $T_0L$ with which the phase difference from $T_0E$ is largest of the three outputs.

Consequently, in S306, the CPU 14 selects the output of the signal line $T_0L$ as the output of the switching control unit 13. Further, in S306, the CPU 14 makes a setting so that the delay amount A is corrected by an amount corresponding to +200 ps. Due to this, the output of the switching control unit 13 is further adjusted in the delayed phase direction, and therefore, it is made possible to transfer data more stably. Then, the processing of the flowchart in FIG. 6 is completed.

Step S307: The CPU 14 determines whether or not the flag $T_0\_D$ is "6". When the determination result is affirmative (YES side), processing moves to S308. On the other hand, when the determination result is negative (NO side), processing moves to S309.

Figure 7C:
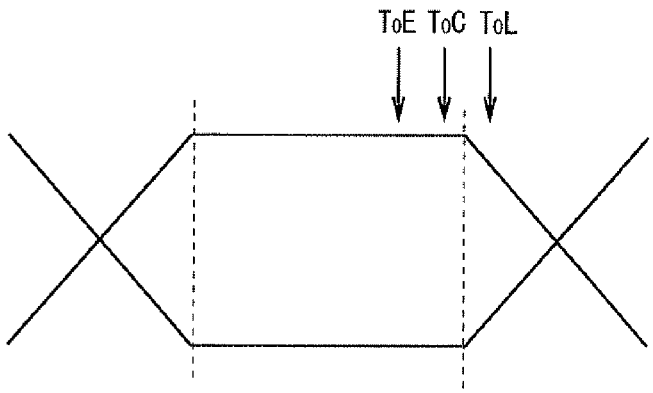
FIG. 7C is a diagram showing an example of a sampling state in S308.

Step S308: This case is a case where the data stream to be detected can be detected from $T_0E$ and $T_0C$ successive in the order of phase of the three signal lines in the first data obtaining unit 22 (see FIG. 7C). In this case, the fall and the rise of the waveform exist between the phase of $T_0C$ and the phase of $T_0L$, and therefore, it is possible to sample data more stably when using the output of $T_0E$ with which the phase difference from $T_0L$ is largest of the three outputs.

Consequently, in S308, the CPU 14 selects the output of the signal line $T_0E$ as the output of the switching control unit 13. Further, in S308, the CPU 14 makes a setting so that the delay amount A is corrected by an amount corresponding to −200 ps. Due to this, the output of the switching control unit 13 is further adjusted in the advanced phase direction, and therefore, it is made possible to transfer data more stably. Then, the processing of the flowchart in FIG. 6 is completed.

Step S309: The CPU 14 determines whether or not the flag $T_{45}\_D$ is "4". When the determination result is affirmative (YES side), processing moves to S310. On the other hand, when the determination result is negative (NO side), processing moves to S311.

Step S310: This case is a case where the data stream to be detected can be detected from $T_{45}C$ and $T_{45}L$ successive in the order of phase of the three signal lines in the second data obtaining unit 23. In S310, the CPU 14 selects the output of the signal line $T_{45}L$ as the output of the switching control unit 13. Further, in S310, the CPU 14 makes a setting so that the delay amount A is corrected by an amount corresponding to +200 ps. Then, the processing of the flowchart in FIG. 6 is completed. S310 is substantially the same as S306 described above, and therefore, explanation duplicated with S306 is omitted.

Step S311: The CPU 14 determines whether or not the flag $T_{45}\_D$ is "6". When the determination result is affirmative (YES side), processing moves to S312. On the other hand, when the determination result is negative (NO side), processing moves to S313.

Step S312: This case is a case where the data stream to be detected can be detected from $T_{45}E$ and $T_{45}C$ successive in the order of phase of the three signal lines in the second data obtaining unit 23. In S312, the CPU 14 selects the output of the signal line $T_0E$ as the output of the switching control unit 13. Further, in S312, the CPU 14 makes a setting so that the delay amount A is corrected by an amount corresponding to −200 ps. Then, the processing of the flowchart in FIG. 6 is completed. S312 is substantially the same as S308 described above, and therefore, explanation duplicated with S308 is omitted.

Step S313: The CPU 14 determines whether or not the flag $T_0\_D$ is "1". When the determination result is affirmative (YES side), processing moves to S314. On the other hand, when the determination result is negative (NO side), processing moves to S315.

Step S314: This case is a case where the data stream to be detected can be detected from $T_0E$ of the three signal lines in the first data obtaining unit 22. In this case, it can be thought that the fall and the rise of the waveform exist between the phase of $T_0E$ and the phase of $T_0C$.

Consequently, in S314, the CPU 14 selects the output of the signal line $T_0E$ as the output of the switching control unit 13. Further, in S314, the CPU 14 makes a setting so that the delay amount A is corrected by an amount corresponding to −200 ps. Due to this, the output of the switching control unit 13 is further adjusted in the advanced phase direction, and therefore, it is made possible to transfer data more stably. Then, the processing of the flowchart in FIG. 6 is completed.

In S314, it may also be possible for the CPU 14 to shift the delay amount A more in the advanced phase direction.

Step S315: The CPU 14 determines whether or not the flag $T_0\_D$ is "3". When the determination result is affirmative (YES side), processing moves to S316. On the other hand, when the determination result is negative (NO side), processing moves to S317.

Step S316: This case is a case where the data stream to be detected can be detected from $T_0L$ of the three signal lines in the first data obtaining unit 22. In this case, it can be thought that the fall and the rise of the waveform exist between the phase of $T_0C$ and the phase of $T_0L$.

Consequently, in S316, the CPU 14 selects the output of the signal line $T_0L$ as the output of the switching control unit 13. Further, in S316, the CPU 14 makes a setting so that the delay amount A is corrected by an amount corresponding to +200 ps. Due to this, the output of the switching control unit 13 is further adjusted in the delayed phase direction, and therefore, it is made possible to transfer data more stably. Then, the processing of the flowchart in FIG. 6 is completed.

In S316, it may also be possible for the CPU 14 to shift the delay amount A more in the delayed phase direction.

Step S317: The CPU 14 determines whether or not the flag $T_{45}\_D$ is "1". When the determination result is affirmative (YES side), processing moves to S318. On the other hand, when the determination result is negative (NO side), processing moves to S319.

Step S318: This case is a case where the data stream to be detected can be detected from $T_{45}E$ of the three signal lines in the second data obtaining unit 23. In S318, the CPU 14 selects the output of the signal line $T_{45}E$ as the output of the switching control unit 13. Further, in S318, the CPU 14 makes a setting so that the delay amount A is corrected by an amount corresponding to −200 ps. Then, the processing of the flowchart in FIG. 6 is completed. S318 is substantially the same as S314 described above, and therefore, explanation duplicated with S314 is omitted.

Step S319: The CPU 14 determines whether or not the flag $T_{45}\_D$ is "3". When the determination result is affirmative (YES side), processing moves to S320. On the other hand, when the determination result is negative (NO side), processing moves to S321.

Step S320: This case is a case where the data stream to be detected can be detected from $T_{45}L$ of the three signal lines in the second data obtaining unit 23. In S320, the CPU 14 selects the output of the signal line $T_{45}L$ as the output of the switching control unit 13. Further, in S320, the CPU 14 makes a setting so that the delay amount A is corrected by an amount corresponding to +200 ps. Then, the processing of the flowchart in FIG. 6 is completed. S320 is substantially the same as S316 described above, and therefore, explanation duplicated with S316 is omitted.

Step S321: The CPU 14 determines whether or not the flag $T_0\_D$ is "2" or "5". When the determination result is affirmative (YES side), processing moves to S323. On the other hand, when the determination result is negative (NO side), processing moves to S322.

Step S322: The CPU 14 determines whether or not the flag $T_{45}\_D$ is "2" or "5". When the determination result is affirmative (YES side), processing moves to S323. On the other hand, when the determination result is negative (NO side), processing moves to S324.

Step S323: These cases correspond to a case where the waveform of serial transfer data is disturbed. In S323, the CPU 14 appropriately selects the output of the switching control unit 13 from the signal line in which the data stream to be detected can be detected. Further, in S323, the CPU 14 applies the delay amount A as it is without correction. Then, the processing of the flowchart in FIG. 6 is completed.

Step S324: This case corresponds to a case where the flags $T_0\_D$ and $T_{45}\_D$ are both "0" and the data stream to be detected cannot be detected from each output of the first data obtaining unit 22 and the second data obtaining unit 23.

In this case, the CPU 14 selects the output of the signal line $T_0C$ in the reference phase as the output of the switching control unit 13. Then, the CPU 14 makes a setting so that the delay amount A of the delay circuit 21 is corrected and thereby the phase of the signal line $T_0C$ shifts up to the phase corresponding to the average of the output of $T_0L$ and the output of $T_{45}E$ ($A=(T_0L+T_{45}E)/2$). Because of this, even when the data stream to be detected cannot be detected at all resulting from the shift in phase, the phase of serial transfer data is adjusted appropriately. Then, the processing of the flowchart in FIG. 6 is completed.

(Step S107)

The switching control unit 13 outputs the output of the signal line selected in S106 to a circuit in the post stage and at the same time, terminates the operation of the determining unit 24 in response to the instruction of the CPU 14. The delay circuit 21 of the delay unit 12 corrects the delay amount A in response to the instruction of the CPU 14.

Due to this, the serial transfer data output from the transmitting unit 11 in the data transfer after the phase adjustment processing passes through the delay unit 12 and the switching control unit 13, and thereby, is output to a circuit in the post stage in a state where its phase is adjusted appropriately.

Figure 4:
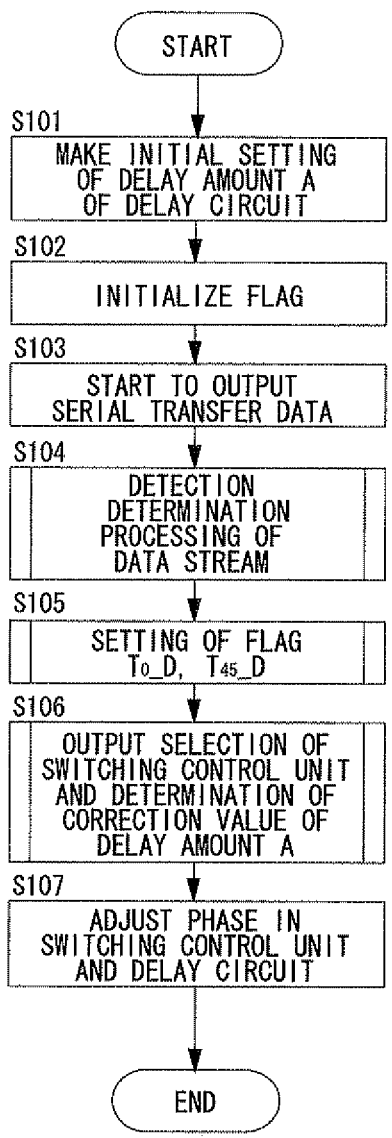
FIG. 4 is a flowchart showing an operation example of phase adjustment processing in one embodiment.

It is also possible for the CPU 14 to accurately monitor the code of the serial transfer data to be input by using information during the period from the transmission of the data stream to be detected to the detection by the determining unit 24 and information of the CASE number corresponding to the signal line selected in S106. The explanation of the flowchart in FIG. 4 is completed as above.

As a timing at which the delay amount A is corrected, it may also be possible to make correction in the blank period of one horizontal output. It is possible to determine and specify the blank period in signal data by counting the number of pixels from the horizontal synchronizing signal output.

The phase adjusting device in one embodiment determines whether or not the data stream to be detected can be detected in the first output ($T_0C$) in the reference phase and in the second output ($T_0E$, $T_0L$) slightly advanced or delayed with respect to the first output. Similarly, the phase adjusting device determines whether or not the data stream to be detected can be detected in the third output ($T_{45}C$) having a phase difference of 45 degrees with respect to the reference phase and in the fourth output ($T_{45}E$, $T_{45}L$) slightly advanced or delayed with respect to the third output.

Then, the phase adjusting device applies the output in which the data stream to be detected can be detected of the first output to the fourth output. Further, the phase adjusting device adjusts the delay amount to be given to the serial transfer data based on the detection result of the first output to the fourth output by selecting a signal line to be output to a circuit in the post stage and by correcting the delay amount in the delay circuit 21. Due to this, it is possible for the phase adjusting device in one embodiment to easily suppress the shift in phase of serial transfer data resulting from a change of the temperature environment etc. of the device.

Further, in the phase adjusting device in one embodiment, the code in the reference phase and the code in a phase of 45 degrees ¼ of period shifted from the reference phase are taken in, and therefore, it is made possible to efficiently adjust the shift in phase of serial transfer data even when synchronization is not established between the serial transfer data and the clock signal. Furthermore, in the phase adjusting device in one embodiment, the code given a minute phase difference with the reference phase as a center and the code given a minute phase difference with the phase of 45 degrees as a center are taken in, and therefore, it is made possible to adjust the phase of the serial transfer data with higher precision (see FIG. 2).

(Modified Example of One Embodiment)

In the above-mentioned embodiment, the example is explained in which the reference phase of the first data obtaining unit 22 differs 45 degrees from the phase of the output, which is the center in the second data obtaining unit 23, but, it is possible to appropriately change the phase difference between both in the range from 35 degrees to 55 degrees.

Figure 8:
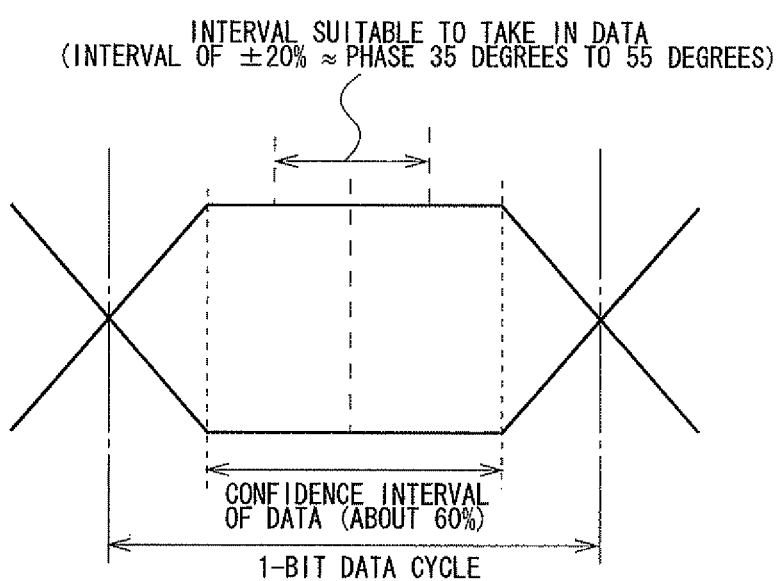
FIG. 8 is an explanatory diagram of a modified example in one embodiment.

In general, the design of serial transfer of data is requested to secure an interval corresponding to an amount of about 60% of the 1-bit data cycle as the confidence interval of the data. Then, the interval suitable to take in the data in the above-mentioned confidence interval is the interval of ±20% with the center of the 1-bit data cycle as a reference. The above-mentioned interval of ±20% is expressed in terms of phase by a range from 35 degrees to 55 degrees from the reference phase (see FIG. 8).

Consequently, it is possible to practically obtain substantially the same effect as that in one embodiment even if the phase difference between the reference phase of the first data obtaining unit 22 and the phase of the output, which is the center in the second data obtaining unit 23, is changed in the above-mentioned range.

<Supplementary Items of the Embodiments>

(1) The phase adjusting device of the present invention is not limited to the example in which the phase adjusting device is incorporated in an electronic camera and may be incorporated in another kind of electronics device. Further, in the embodiments described above, the example of the device that performs serial transfer using one channel is explained, but, it is of course possible to apply the present invention to a case of a plurality of channels.

(2) It is needless to say that the delay amounts of the signal lines $T_0E$, $T_0C$, $T_0L$, $T_{45}E$, $T_{45}C$, and $T_{45}L$ in the above-mentioned embodiments are changed appropriately according to the serial transfer data to be handled. Further, by appropriately adjusting the delay amount of each delay element (22a to 22c and 23a to 23c) of the first data obtaining unit 22 and the second data obtaining unit 23 using programs in the phase adjusting device in one embodiment, it is also possible to share the phase adjusting device having the same configuration in different devices.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it Is not desired to limit the inventive embodiments to the exact construction and operation illustrated and described, and accordingly all suitable modifications and equivalents may be resorted to, falling within the scope thereof.

What is claimed is:

1. A phase adjusting device comprising:
a first data obtaining unit obtaining each of a first output in a reference phase of serial transfer data to be input and a second output being given a phase difference to the first output by a first delay amount;
a second data obtaining unit obtaining each of a third output being given a phase difference to the first output by a second delay amount and a fourth output being given a phase difference to the third output by the first delay amount, the second delay amount being larger than the first delay amount;
a determining unit determining whether or not a data stream to be detected included in the serial transfer data can be detected in each output of the first data obtaining unit and the second data obtaining unit; and
a phase adjusting unit adjusting a delay amount given to the serial transfer data to be output based on a determination result by the determining unit.

2. The phase adjusting device according to claim 1, wherein
the phase adjusting unit performs adjustment using a delay amount of an output in which the data stream can be detected among each output of the first data obtaining unit and the second data obtaining unit.

3. The phase adjusting device according to claim 2, wherein
the phase adjusting unit performs adjustment using an average of the second output and the fourth output when the data stream cannot be detected in each output of either the first data obtaining unit or the second data obtaining unit.

4. The phase adjusting device according to claim 1, wherein
a phase of the third output has a phase difference in a range from 35 degrees to 55 degrees with respect to the reference phase.

5. The phase adjusting device according to claim 1, wherein
the second output includes two kinds of outputs being given a phase lead and a phase lag, respectively, by the first delay amount to the first output, and
the fourth output includes two kinds of outputs being given a phase lead and a phase lag, respectively, by the first delay amount to the third output.

6. The phase adjusting device according to claim 5, wherein
the phase adjusting unit performs adjustment using:
a delay amount of one of the first output and the third output when the data stream can be detected in all three outputs in either an output group including the first output and the second output or an output group including the third output and the fourth output; and
a delay amount of an output with a largest phase difference to an output in which the data stream cannot be detected among three outputs when the data stream can be detected in two outputs successive in order of phase in either the output group including the first output and the second output or the output group including the third output and the fourth output.

7. A camera comprising the phase adjusting device according to claim 1.

* * * * *